United States Patent
Naidu et al.

(10) Patent No.: US 11,061,062 B2
(45) Date of Patent: Jul. 13, 2021

(54) TRAVELLING WAVE BASED METHOD FOR LOCATING A FAULT IN A TRANSMISSION LINE AND DEVICE THEREFOR

(71) Applicant: ABB Power Grids Switzerland AG, Baden (CH)

(72) Inventors: Obbalareddi Demudu Naidu, Bengaluru (IN); Neethu George, Kottayam (IN); Sachin Srivastava, Bengaluru (IN)

(73) Assignee: ABB Power Grids Switzerland AG, Baden (CH)

( * ) Notice: Subject to any disclaimer, the term of this patent is extended or adjusted under 35 U.S.C. 154(b) by 66 days.

(21) Appl. No.: 16/474,054

(22) PCT Filed: Apr. 20, 2017

(86) PCT No.: PCT/IB2017/052270
§ 371 (c)(1),
(2) Date: Jun. 26, 2019

(87) PCT Pub. No.: WO2018/122627
PCT Pub. Date: Jul. 5, 2018

(65) Prior Publication Data
US 2019/0369156 A1    Dec. 5, 2019

(30) Foreign Application Priority Data
Dec. 28, 2016 (IN) .............. 201641044552

(51) Int. Cl.
*G01R 31/08* (2020.01)
(52) U.S. Cl.
CPC ................. *G01R 31/085* (2013.01)
(58) Field of Classification Search
CPC ...... G01R 31/013–11; G01R 31/50–55; G01R 31/58
See application file for complete search history.

(56) References Cited

U.S. PATENT DOCUMENTS

| 4,766,549 A | 8/1988 | Schweitzer, III et al. |
| 5,206,595 A * | 4/1993 | Wiggins ............. G01R 31/08 324/532 |

(Continued)

FOREIGN PATENT DOCUMENTS

| CN | 102426323 A | 4/2012 |
| CN | 101923139 B | 5/2012 |

(Continued)

OTHER PUBLICATIONS

Coggins et al., "Initial Experiences with a New FPGA Based Traveling Wave Fault Recorder Installed on a MW Distribution Network", Power System Technology and IEEE Power India Conference, Oct. 12, 2008, pp. 1-8.

(Continued)

*Primary Examiner* — Patrick Assouad
*Assistant Examiner* — Demetrius R Pretlow
(74) *Attorney, Agent, or Firm* — Slater Matsil, LLP

(57) ABSTRACT

The invention provides an Intelligent Electronic Device (IED) and a method for locating a fault in a power transmission line with the IED. The method comprises measuring arrival times of a first, second and third peak of a travelling wave, using measurements obtained with one or more measurement equipment connected with the power transmission line. The method further comprises generating two or more initial estimates for the location of the fault, estimating time of initiation of the travelling wave, and estimating an arrival time of the third peak. The estimated arrival time of the third peak is compared with the measured arrival time of the third peak, to select an initial estimate of the two or more initial estimates as the location of the fault.

19 Claims, 3 Drawing Sheets

(56) References Cited

U.S. PATENT DOCUMENTS

| | | | |
|---|---|---|---|
| 5,272,439 A * | 12/1993 | Mashikian | G01R 31/1272 324/520 |
| 8,655,609 B2 | 2/2014 | Schweitzer, III et al. | |
| 2002/0161539 A1* | 10/2002 | Jones | H04B 3/493 702/79 |
| 2004/0153264 A1* | 8/2004 | Teich | G01R 27/2647 702/65 |
| 2006/0012374 A1* | 1/2006 | Kojovic | G01R 31/088 324/522 |
| 2012/0146666 A1* | 6/2012 | Bottman | G01R 31/11 324/627 |
| 2013/0096854 A1* | 4/2013 | Schweitzer, III | G01R 31/085 702/59 |
| 2015/0081234 A1 | 3/2015 | Schweitzer, III et al. | |
| 2015/0081235 A1 | 3/2015 | Schweitzer, III et al. | |
| 2015/0081236 A1* | 3/2015 | Schweitzer, III | G01R 31/085 702/59 |
| 2015/0212025 A1* | 7/2015 | Francis-Buller | G01R 31/11 324/693 |
| 2016/0077149 A1 | 3/2016 | Schweitzer, III et al. | |
| 2016/0216310 A1 | 7/2016 | Schweitzer, III et al. | |
| 2016/0266192 A1 | 9/2016 | Burek et al. | |
| 2016/0327604 A1* | 11/2016 | Ioana | G01R 31/088 |
| 2017/0102426 A1* | 4/2017 | Schweitzer, III | G01R 31/11 |
| 2017/0110875 A1* | 4/2017 | Schweitzer, III | H02H 7/22 |
| 2018/0059164 A1* | 3/2018 | Cohen | G01R 31/11 |
| 2018/0136269 A1* | 5/2018 | Schweitzer, III | G01R 31/11 |
| 2018/0372789 A1* | 12/2018 | King | G01R 31/085 |
| 2019/0079131 A1* | 3/2019 | Pinhasi | G01R 31/088 |
| 2019/0212382 A1* | 7/2019 | Guzman-Casillas | G01R 31/085 |

FOREIGN PATENT DOCUMENTS

| | | |
|---|---|---|
| CN | 102435924 A | 5/2012 |
| CN | 102707196 A | 10/2012 |
| CN | 103116112 A | 5/2013 |
| CN | 103969554 A | 8/2014 |
| CN | 103983901 A | 8/2014 |
| CN | 105474022 A | 4/2016 |
| CN | 105492915 A | 4/2016 |
| CN | 105705956 A | 6/2016 |
| EP | 1679777 A1 | 7/2006 |
| WO | 2013071974 A1 | 5/2013 |
| WO | 2015039113 A1 | 3/2015 |
| WO | 2016139613 A1 | 9/2016 |

OTHER PUBLICATIONS

Naidoo et al., "A protection sytem for long HVDC transmission lines", Power Engineering Society Inaugural Conference and Exposition, Jul. 11, 2005, pp. 150-155.

Thomas et al., "Ultra-High Speed Protection of Series Compensated Lines", IEEE Transactions on Power Delivery, vol. 7, No. 1, Jan. 1, 1992, pp. 139-145.

Tag et al., "A wavelet-based fault location technique for aged power cables", Power Engineering Society General Meeting, Jun. 12, 2005, pp. 430-436.

International Search Report for PCT/IB2017/052270, dated Oct. 12, 2017, 4 pages.

International Preliminary Report on Patentability and Written Opinion for PCT/IB2017/052270, dated Oct. 12, 2017, 6 pages.

Livani, H.; Evrenosoglu, C.Y. "A Machine Learning and Wavelet-Based Fault Location Method for Hybrid Transmission Lines", Smart Grid, IEEE Transactions on, On pp. 51-59 vol. 5, Issue: 1, Jan. 2014.

Livani. H., Evrenosoglu, C.Y. "A hybrid fault location method for overhead lines combined with underground cables using DWT and SVM", Power and Energy Society General Meeting, 2012 IEEE, on pp. 1-6.

Livani. H., Evrenosoglu, C.Y. "A traveling wave based single-ended fault location algorithm using DWT for overhead lines combined with underground cables" power and energy society general meeting, 2010 IEEE, on pp. 1-6.

http://materias.fi.uba.ar/6209/download/HP-AN1285.pdf.

http://www.qualitrolcorp.com/Products/TWS_FL-8_and_TWS_FL-1_Traveling_wave_fault_locators/.

M. M. Saha, J. J. Izykowski, and E. Rosolowski, Fault Location on Power Networks, 1st ed. New York, NY, USA: Springer-Verlag, 2010.

S. Das, S. Santoso, A Gaikwad and M. Patel, "Impedance-Based Fault Location in Transmission Networks: Theory and Application", Access, IEEE, vol. 2, pp. 537-557.

* cited by examiner

TRAVELLING WAVE BASED METHOD FOR LOCATING A FAULT IN A TRANSMISSION LINE AND DEVICE THEREFOR

CROSS-REFERENCE TO RELATED APPLICATIONS

This application is a U.S. national stage of International Application Serial No. PCT/IB2017/052270, filed Apr. 20, 2017, which claims priority to Indian Patent Application No. 201641044552, filed Dec. 28, 2016. The entire disclosures of both of the foregoing applications are incorporated herein by reference.

FIELD OF THE INVENTION

The present invention relates generally to locating faults in power transmission lines, and more specifically to travelling wave based fault location.

BACKGROUND OF THE INVENTION

Accurate fault location in transmission lines is very important for maintenance crew to reach the faulted location and undertake repair quickly. Accurate identification of fault location improve the reliability, availability and save the revenue loss for the utilities.

Fault location methods are classified into two categories based on the availability of input quantities, namely single ended and two ended. Additionally, according to fault location principle fault location methods are categorized as 1) Impedance based method and 2) Traveling wave based method Impedance based fault location methods have poor accuracies due to uncertainties in the measurements, filtering techniques and dynamic system conditions.

A travelling wave is an electromagnetic transient travelling across the power circuit and equipment for any sudden change in electrical parameter of the line. For example, faults in a transmission network is one such scenario. These travelling waves follow the electromagnetic parameters of the equipment, which remain constant with respect to system conditions. Hence, travelling wave based methods are more accurate as they are not affected by steady state and dynamic system conditions.

Fault location using traveling wave is estimated by multiplying the time difference between initial traveling waves and/or its reflection at the point and propagation velocity. Communication based travelling wave methods are considered more accurate and reliable. However, the complexity of establishing communication channel is high and reliability of the method depends on the quality of communication. In addition, accurate GPS synchronization at both side is mandatory for communication based methods. This further impacts the accuracy and complexity of fault locator (or IED). Hence, the single ended method is preferred by the most utilities worldwide for fault location.

Travelling waves can be generated by any disturbance across the power transmission line. According to the location of the fault, there is a change in the sequence of reflections/refractions arriving at a known point in the line. Identifying source of traveling wave reflections/refractions, i.e. if the reflection is from the fault or from a known point in the line (e.g. far end bus) is a major challenge in single ended travelling wave based methods. Once the sequence of wave is identified, then fault location can be calculated based on the arrival times.

SUMMARY OF THE INVENTION

Various aspects of the present invention provide an Intelligent Electronic Device (IED) and a method for locating a fault in a power transmission line. The method of the present invention can be used for different types of power transmission lines such as overhead lines, underground cables, mixed lines having overhead lines connected with underground cables as well as different possible combinations of mixed lines such as overhead line connected with underground cable and following with overhead line or underground cable connected with overhead line and following with underground cables etc. In an embodiment of the present invention, the power transmission line connects two substations, wherein a first substation is at a first end of the power transmission line and a second substation is at a second end of the power transmission line.

In accordance with various aspects, the method is performed with the IED. The IED is connected with one or more measurement equipment connected with the power transmission line. For example, the measurement equipment can include a current transformer, a potential transformer, a sensor-based measurement equipment (e.g. Rogowski coils, non-conventional instrument transformers etc.) and/or the like, which provides a signal/measurement corresponding to current, voltage or other information as sensed from the power transmission line. For example, a current transformer provides single/multiple phase current signal and a potential transformer can provide single/multiple phase voltage signal to the IED. The IED may alternately (or additionally) receive measurements from the measurement equipment or other terminals of the power system over a communication channel.

In an embodiment the IED receives a signal(s) from the measurement equipment, and obtain measurements therefrom. In another embodiment, the measurement equipment publishes the measurements over a bus (e.g. process bus), and the IED (e.g. subscribed to receive data from such bus) receives the measurements over the bus.

A travelling wave(s) may be generated due to a fault in the transmission line. The travelling wave may be detected from one or more measurements of electrical parameters (e.g. current/voltage) of the power transmission line, wherein the one or more measurements are obtained with the one or more measurement equipment. Such detection may happen at the IED or at another terminal of the power transmission line. For example, a module(s) to detect travelling wave and parameters thereof, may be provided in another IED or power line device. In an embodiment, the IED has a travelling wave module to detect the travelling wave and parameters thereof (e.g. arrival times of first peak, second peak, third peak etc.). In another embodiment, the travelling wave module receives the travelling wave parameters over the bus (e.g. the IED can be subscribed to receive data published over a process bus).

In accordance with the method, actual time of arrival of a first peak, a second peak and a third peak of the travelling wave are measured. The measurement of the actual time of arrival of the first peak, the second peak and the third peak, or other travelling wave parameters can be performed with the IED, or with another terminal and then transmitted to the IED. In either case, the measured parameters are stored at the IED (e.g. in a memory).

The method further includes generating two or more initial estimates of the location of the fault. The two or more initial estimates can be performed with an initial estimate module of the IED. In an embodiment, a first initial estimate (d1) of the two or more estimates is generated based on:
  the arrival time of the first peak,
  the arrival time of the second peak, and
  a velocity of propagation of the travelling wave.

Further, a second initial estimate (d2) of the two or more estimates is generated based on:
  the arrival time of the first peak,
  the arrival time of the second peak,
  the velocity of propagation of the travelling wave, and
  length of the power transmission line.

The method also includes estimating a time of initiation (t0_estimate) of the travelling wave. A time estimate module of the IED can generate t0_estimate. t0_estimate is generated based on the arrival time of one of the first peak and the second peak, one of the two initial estimates (d1 or d2 respectively), and the velocity of propagation of the travelling wave. Optionally length of the power transmission line may be used for generating t0_estimate.

In addition, the method includes estimating an arrival time of the third peak (t3_estimate) based on one of the first initial estimate (d1) and the second initial estimate (d2), the estimate of time of initiation of the travelling wave, and the velocity of propagation of the travelling wave. Optionally length of the power transmission line may be used for generating t3_estimate. The time estimate module of the IED generates t3_estimate. t3_estimate can be generated by identifying distance corresponding to the third peak.

Thereafter, the method includes determining the location of the fault based on a comparison of the estimated arrival time of the third peak with the measured arrival time of the third peak. A fault location module of the IED determines the location of the fault in accordance with an embodiment of the invention.

In one embodiment, the difference between the estimated and measured arrival time of the third peak is compared with a threshold value(s) (e.g. with the IED). There could be multiple threshold values with the IED for comparison between the estimated and actual values of the arrival time of the third peak. In an embodiment, the first initial estimate is selected as the location of the fault if the difference between the estimate of arrival time of the third peak is less than the actual (recorded) time of arrival of the third peak by a value less than the threshold value. In accordance with the embodiment, the second initial estimate is selected as the location of the fault if the difference is greater than the threshold value.

In an embodiment, the IED communicates measurements with a server (e.g. cloud server). For example, there could be a communication channel between the IED and the server. In such a case, the server can perform the processing and calculate the fault location and publish it across the subscribers (including the IED).

DETAILED DESCRIPTION

Faults in transmission lines occur because of several reasons. A travelling wave(s) may be generated due to a fault in a power transmission line. Depending on the location of the fault, a particular peak (e.g. second peak) of the travelling wave can be of a reflection from the fault point, or from a known point in the line. The location of the fault can be calculated based on second peak information, i.e. if it is known whether the second is coming from fault point or far end bus (or other known point in the line such as junction of an overhead line and cable section).

Figure 2:
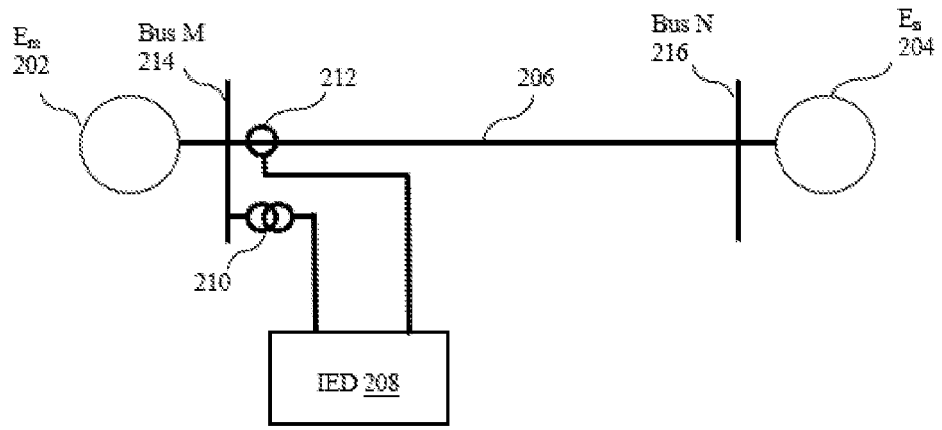
FIG. 2 is a simplified diagram of a system for locating a fault in a power transmission line, in accordance with an embodiment of the invention.

Referring to FIG. 2, a first substation ($E_m$ 202) can be at one end (first) of the power transmission line and a second substation ($E_n$ 204) at another end (second) of the power transmission line (206). Further, as shown, an Intelligent Electronic Device (208) may be operating at bus M (214). The IED can be connected with one or more measurement equipment. For example, the IED gets the voltage and current measurement input from the potential transformer (PT 210) and current transformer (CT 212) respectively, and such information can be stored in Disturbance Fault Recorder (DFR). In an embodiment, a voltage/current travelling wave is extracted from the information stored in the DFR. The extracted travelling wave is then used to estimate the fault location. Such travelling wave detection (and detection of parameters thereof) may be performed in another IED or power line device, and transmitted to the IED (e.g. over a bus on which the IED is subscribed).

The major challenge in calculation of fault location, using such a single ended travelling wave system (shown in FIG. 2) is identifying source of traveling wave reflections/refractions, i.e. if the reflection is from the fault or far end bus (or other known point on the power transmission line).

Figure 1A:
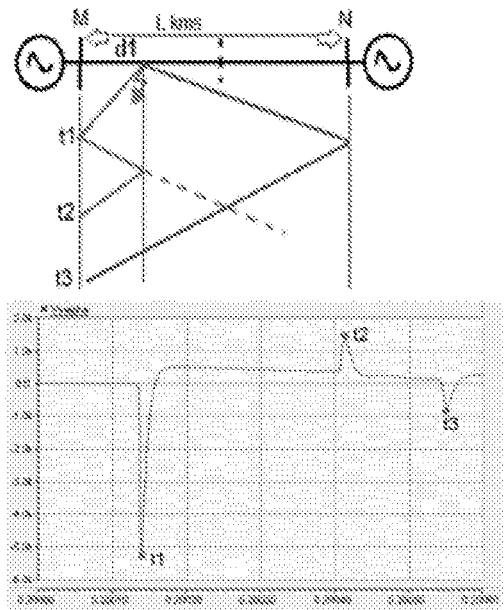
FIG. 1a and FIG. 1b show example Bewley Lattice diagrams.
Figure 3:
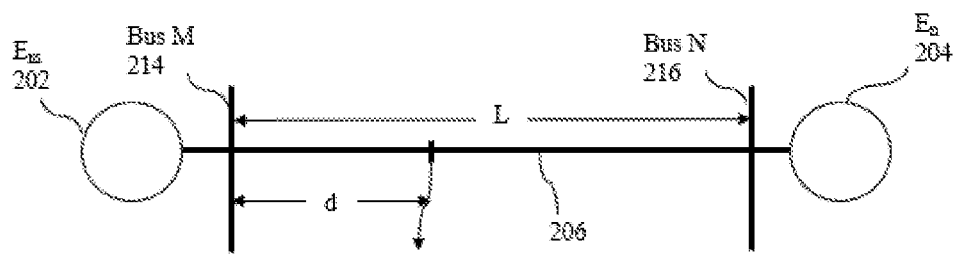
FIG. 3 is a simplified diagram showing a fault in the power transmission line, in accordance with an embodiment of the invention.

FIG. 1(a) shows Bewley Lattice diagram for case, when the fault has occurred in a first half of the power transmission line. Here, the power transmission line is an overhead line (OHL). In this case the first peak as well as the second peak comes from the fault point. For a fault at 'd1' km from terminal M, where L is the length of the power transmission line (shown in FIG. 3), first and second peak arrival times can be expressed as in equation (1) and (2) below:

$$t1 = t0 + \frac{d1}{V} \qquad (1)$$

$$t2 = t0 + \frac{3d1}{V} \qquad (2)$$

where,
  v is propagation velocity of transmission line (velocity of propagation of the travelling wave in the line),
  t0 is fault initiated time (time of initiation of the travelling wave),
  t1 is first peak arrival time (arrival time of first peak of the travelling wave),
  t2 is second peak arrival time (arrival time of first peak of the travelling wave), d1 is first estimate of fault location (e.g. corresponding to a fault in first half of the line), 3d1 is used in equation (2) because second peak traveled 3d1 distance (as can be seen from FIG. 1(a), three times the distance d1 has to be covered for the second peak to reach bus M).

Solving both the equations, fault location for fault in first half is given by equation (3):

$$d1 = (t2 - t1) \times \frac{V}{2} \tag{3}$$

Figure 1B:
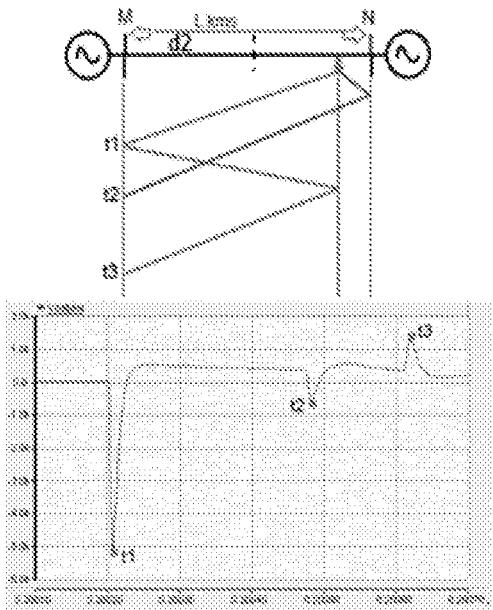

The Bewley Lattice diagram of FIG. 1(b) shows the case when fault has occurred in second half of the line. In this case, the first peak corresponds to reflection from fault point and the second peak corresponds to reflection from far end bus. For a fault at 'd2' km from terminal M, first and second peak arrival times can be expressed as in equation (4) and (5) below.

$$t1 = t0 + \frac{d2}{V} \tag{4}$$

$$t2 = t0 + \frac{(L + L - d2)}{V} \tag{5}$$

Solving both the equations, fault location in second half is given by, $$d2 = L - (t2 - t1) \times \frac{V}{2} \tag{6}$$

Hence, to select the actual fault location from the two initial estimates calculated using equation (3) and (6), we need to know if the fault has occurred in the first half or the second half of the line.

The present invention solves the challenge of identification of the actual fault location from the two possible location estimates, by using the third peak arrival time information.

The present invention provides an IED (300) for locating the fault in the power transmission line. The IED can operate at bus M (214) (such as IED 208 shown in FIG. 2), bus N (216) or other known point of the power transmission line. The IED can communicate with one or more measurement equipment (such as voltage transformer 210, current transformer 212 etc. over a bus) for obtaining measurements of the power transmission line. The IED can have one or multiple modules for locating the fault in the power transmission line.

Figure 4:
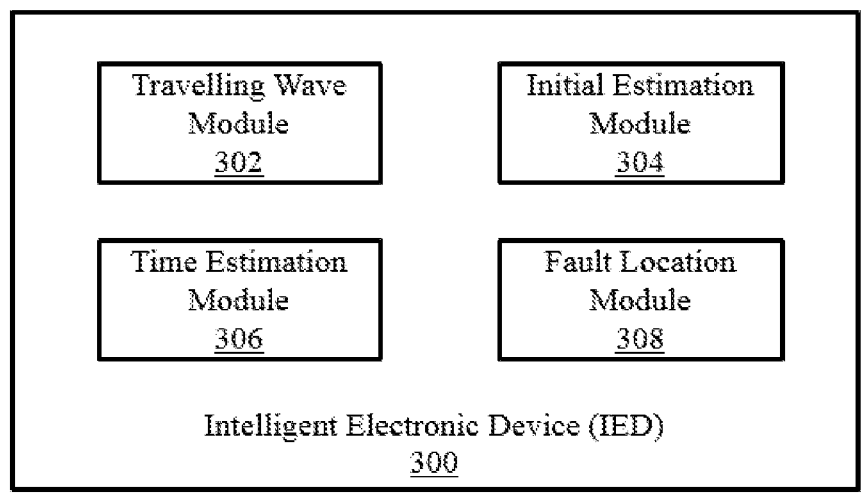
FIG. 4 is a simplified block diagram of an intelligent electronic device for locating the fault in the power transmission line, in accordance with an embodiment of the invention.

In the embodiment shown in FIG. 4, the IED (300) has a travelling wave module (302), an initial estimate module (304), a time estimate module (306) and a fault location module (308).

Figure 5:
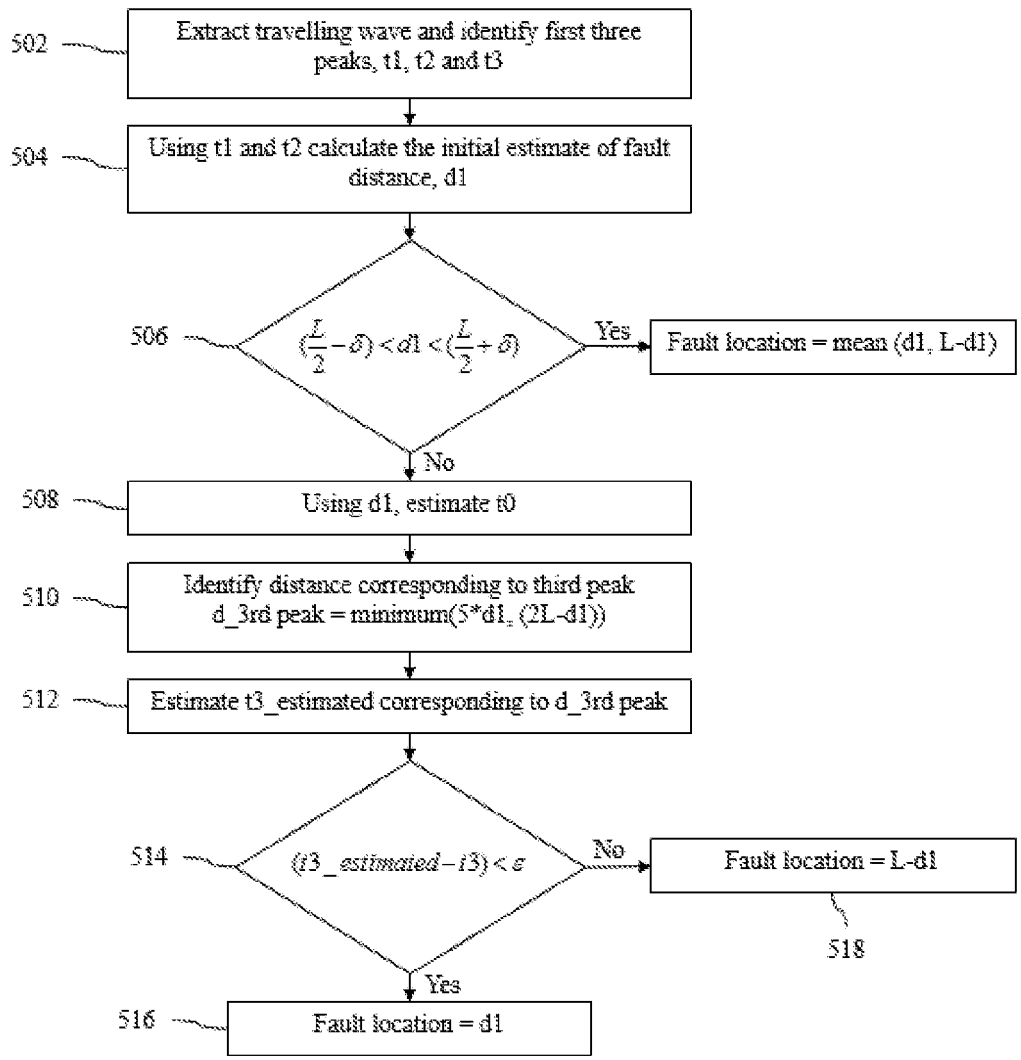
FIG. 5 is a flowchart of a method for locating the fault in the power transmission line, in accordance with an embodiment of the invention.

Referring to FIG. 5, which is a flowchart of the method of locating the fault, in accordance with an embodiment.

Let the time of first peak of the travelling wave measured at M be t1, the time of second peak of the travelling wave measured at M be t2 and the time of third peak of the travelling wave measured at M be t3_actual. The arrival times may be measured with the travelling wave module, or received from another terminal, and recorded with the travelling wave module at 502.

Two or more initial estimates of fault location are generated at 504. Such initial estimates are generated with initial estimate module of the IED. In one embodiment, two initial estimates of fault location, d1 (first initial estimate) and d2 (second initial estimate), are obtained using equations (3) and (6). Equation (3) gives a fault location estimate, d1, in the first half of the line. Similarly, equation (6) gives the fault location estimate, d2, in the second half of the line. This may be irrespective of the actual fault location being in first half or second half.

In cases where the initial fault estimates d1 and d2, is very close to the midpoint of the line, the actual fault location can be calculated as average of d1 and d2. Such determination may be optionally made at 506 by comparing d1 with $$\left(\frac{L}{2} - \delta\right) \text{ and } \left(\frac{L}{2} + \delta\right).$$

This can improve accuracy for faults close to the midpoint of the transmission line.

At 508, an estimate of fault initiated time (or time of initiation of travelling wave), t0 is obtained. Such estimation can be performed with the time estimate module of the IED. The estimated fault location (d1) can be substituted in equation (1) to calculate fault initiated time (t0). Alternately, d2 can be substituted in equation (5) to obtain t0. Optionally length of the power transmission line may be used for generating t0 estimate.

Using the known fault location estimate (d1) and fault initiated time (t0), the distance corresponding to the third peak, 'd_3 rd peak' can be calculated using equation (7) at 510. Minimum is used in equation (7) because 3rd peak can also come from fault point or reflection from far end bus.

$$d\_3rd \text{ peak} = \text{minimum}(5*d1, (2L - d1)) \tag{7}$$

In place of d1, d2 may be used for identifying distance corresponding to the third peak.

At 512, an estimate of arrival time of the third peak (t3_estimated) is generated. This estimation can be performed with the time estimate module of the IED. t3_estimated can be estimated using equation (8).

$$t_{3\_estimated} = t_0 + \frac{d\_3rdpeak}{V} \tag{8}$$

At 514, measured and estimated third peak arrival time are compared. This comparison can be performed with the fault location module. This step compares the actual measured third peak time 't3_actual' to the estimated third peak time 't3_estimated'.

If the difference between t3_estimated and t3_actual measured from the travelling wave is less than a threshold value (with the IED), the actual fault distance is d1 (516). The threshold may be based on sampling frequency of the IED. For example, 2 microseconds for 1 MHz sampling may be set as threshold. If the difference is greater than the threshold, it means the initial estimate d1 is not the actual fault location. Instead d2 is the actual fault location (518). It is possible to have a zero threshold value, for such comparison.

Thus the present invention provides a solution for accurately identifying the actual fault location with actual arrival time information of the first, second and third peaks in a travelling wave. Third peak in the travelling wave is available for faults in transmission lines, even when the fault inception angle is zero, thereby leading to accurate fault location. The identified location information can be communicated to maintenance crew to reach the faulted location and undertake repair quickly.

The invention claimed is:

1. A method for locating a fault in a power transmission line with an Intelligent Electronic Device (IED), the method comprising:
obtaining one or more measurements of electrical parameters of the power transmission line with one or more measurement equipment connected with the power transmission line;
measuring an arrival time of a first peak of a travelling wave, an arrival time of a second peak of the travelling wave, and an arrival time of a third peak of the travelling wave detected, the travelling wave being detected from the one or more measurements of electrical parameters of the power transmission line;
generating two or more initial estimates of a location of the fault, a first initial estimate of the two or more initial estimates being generated based on the arrival time of the first peak, the arrival time of the second peak, and a velocity of propagation of the travelling wave, and a second initial estimate of the two or more initial estimates being generated based on the arrival time of the first peak, the arrival time of the second peak, the velocity of propagation of the travelling wave, and length of the power transmission line;
estimating a time of initiation of the travelling wave based on one of:
the arrival time of the first peak, the first initial estimate and the velocity of propagation of the travelling wave,
the arrival time of the second peak, the second initial estimate, and the velocity of propagation of the travelling wave, and
the arrival time of the second peak, the second initial estimate, the velocity of propagation of the travelling wave, and the length of the power transmission line;
determining an estimated arrival time of the third peak based on one of:
the first initial estimate, the estimate of the time of initiation of the travelling wave, and the velocity of propagation of the travelling wave,
the second initial estimate, the estimate of the time of initiation of the travelling wave, and the velocity of propagation of the travelling wave, and
the second initial estimate, the estimate of the time of initiation of the travelling wave, the velocity of propagation of the travelling wave, and the length of the power transmission line; and
selecting one of the first initial estimate and the second initial estimate as the location of the fault, based on a comparison of the estimated arrival time of the third peak with the measured arrival time of the third peak.

2. The method as claimed in claim 1, wherein the arrival time of the first peak, the arrival time of the second peak, and the arrival time of the third peak are measured at the IED based on one of:
the one or more measurements recorded with the IED, and
the one or more measurements received at the IED.

3. The method as claimed in claim 1, further comprising selecting the first initial estimate as the location of the fault because a difference between the estimated arrival time of the third peak and the measured arrival time of the third peak is determined to be less than a threshold value.

4. The method as claimed in claim 1, further comprising selecting the second initial estimate as the location of the fault because a difference between the estimated arrival time of the third peak and the measured arrival time of the third peak is determined to be greater than a threshold value.

5. The method as claimed in claim 1, wherein the estimated arrival time of the third peak is determined by identifying a distance corresponding to the third peak.

6. The method as claimed in claim 1, wherein a first substation is connected at a first end of the power transmission line and a second substation is connected at a second end of the power transmission line, and the IED operates at the first end of the power transmission line.

7. A system to detect a location of a fault in a power transmission line, the system comprising:
one or more measurement equipment coupled with the power transmission line; and
an intelligent electronic device in communication with the one or measurement equipment, the intelligent electronic device configured to:
measure an arrival time of a first peak of a travelling wave, an arrival time of a second peak of the travelling wave, and an arrival time of a third peak of the travelling wave, the travelling wave being detected from one or more measurements of electrical parameters of the power transmission line, the one or more measurements being obtained with the one or more measurement equipment,
generate two or more initial estimates of the location of the fault, wherein a first initial estimate of the two or more initial estimates is generated based on the arrival time of the first peak, the arrival time of the second peak, and a velocity of propagation of the travelling wave, and a second initial estimate of the two or more initial estimates is generated based on the arrival time of the first peak, the arrival time of the second peak, the velocity of propagation of the travelling wave and a length of the power transmission line,
estimate a time of initiation of the travelling wave based on one of:
the arrival time of the first peak, the first initial estimate and the velocity of propagation of the travelling wave,
the arrival time of the second peak, the second initial estimate, and the velocity of propagation of the travelling wave, and
the arrival time of the second peak, the second initial estimate, the velocity of propagation of the travelling wave and the length of the power transmission line,
estimate an estimated arrival time of the third peak based on one of:
the first initial estimate, the estimate of the time of initiation of the travelling wave, and the velocity of propagation of the travelling wave,
the second initial estimate, the estimate of the time of initiation of the travelling wave, and the velocity of propagation of the travelling wave, and
the second initial estimate, the estimate of the time of initiation of the travelling wave, the velocity of propagation of the travelling wave and the length of the power transmission line; and
select one of the first initial estimate and the second initial estimate as the location of the fault, based on a comparison of the estimated arrival time of the third peak with the measured arrival time of the third peak.

8. The system as claimed in claim 7, wherein the IED detects the traveling wave from the one or more measurements of electrical parameters of the power transmission line received from the one or more measurement equipment.

9. The system as claimed in claim 7, wherein the intelligent electronic device receives the one or more measurements of electrical parameters from the one or more measurement equipment over a communication channel.

10. The system as claimed in claim 7, further comprising a first substation is connected at a first end of the power transmission line and a second substation is connected at a second end of the power transmission line, and wherein the intelligent electronic device operates at the first end of the power transmission line.

11. A method for locating a fault in a power transmission line with an Intelligent Electronic Device (IED), the method comprising:
obtaining a measurement of electrical parameters of the power transmission line with a measurement equipment connected with the power transmission line;
measuring an arrival time of a first peak of a travelling wave, an arrival time of a second peak of the travelling wave, and an arrival time of a third peak of the travelling wave detected from the measurement of electrical parameters of the power transmission line;
generating a first initial estimate of a location of the fault based on the arrival time of the first peak, the arrival time of the second peak, and a velocity of propagation of the travelling wave;
generating a second initial estimate of the location of the fault based on the arrival time of the first peak, the arrival time of the second peak, the velocity of propagation of the travelling wave, and length of the power transmission line;
estimating an initiation time of the travelling wave based on the arrival time of the first peak, the first initial estimate, and the velocity of propagation of the travelling wave;
determining an estimated arrival time of the third peak based on the first initial estimate, the estimate of the initiation time of the travelling wave, and the velocity of propagation of the travelling wave; and
comparing the estimated arrival time of the third peak and the measured arrival time of the third peak to determine whether the first initial estimate or the second initial estimate is more accurate.

12. The method as claimed in claim 11, wherein the measurement of electrical parameters is recorded with the IED.

13. The method as claimed in claim 11, wherein the measurement of electrical parameters is received at the IED.

14. The method as claimed in claim 11, further comprising determining that a difference between the estimated arrival time of the third peak and the measured arrival time of the third peak is less than a threshold value and determining that the first initial estimate is more accurate than the second initial estimate.

15. The method of claim 14, further comprising determining the threshold value based on a sampling frequency of the IED.

16. The method as claimed in claim 11, further comprising determining that a difference between the estimated arrival time of the third peak and the measured arrival time of the third peak is greater than a threshold value and determining that the second initial estimate is more accurate than the first initial estimate.

17. The method of claim 16, further comprising determining the threshold value based on a sampling frequency of the IED.

18. The method as claimed in claim 11, wherein the estimated arrival time of the third peak is determined by identifying a distance corresponding to the third peak.

19. The method as claimed in claim 18, wherein a first substation is connected at a first end of the power transmission line and a second substation is connected at a second end of the power transmission line, and the IED operates at the first end of the power transmission line.

* * * * *